(12) United States Patent
Karlsson

(10) Patent No.: US 7,724,680 B2
(45) Date of Patent: May 25, 2010

(54) METHOD AND TECHNIQUE FOR THE PROCESSING AND INTELLIGENT DISPLAY OF WIDEBAND DIRECTION-FINDING DATA

(75) Inventor: Lars Karlsson, Los Altos Hills, CA (US)

(73) Assignee: Agilent Technologies, Inc., Santa Clara, CA (US)

(\*) Notice: Subject to any disclaimer, the term of this patent is extended or adjusted under 35 U.S.C. 154(b) by 907 days.

(21) Appl. No.: 11/202,910

(22) Filed: Aug. 11, 2005

(65) Prior Publication Data

US 2006/0034323 A1    Feb. 16, 2006

Related U.S. Application Data

(60) Provisional application No. 60/600,641, filed on Aug. 11, 2004, provisional application No. 60/600,642, filed on Aug. 11, 2004, provisional application No. 60/600,643, filed on Aug. 11, 2004, provisional application No. 60/600,657, filed on Aug. 11, 2004.

(51) Int. Cl.
*G01R 31/08* (2006.01)
*G01S 3/52* (2006.01)

(52) U.S. Cl. .................. 370/252; 370/241; 370/465; 370/265; 600/440; 600/523; 342/417; 342/449; 381/92

(58) Field of Classification Search ............ 370/252, 370/241, 465, 265; 726/4; 435/108; 342/417, 342/449; 128/715; 600/440, 523; 381/92; 358/461

See application file for complete search history.

(56) References Cited

U.S. PATENT DOCUMENTS

| | | | |
|---|---|---|---|
| 4,991,581 A * | 2/1991 | Andries .................. 600/528 |
| 5,313,310 A * | 5/1994 | Numakura et al. .......... 358/461 |
| 7,002,509 B2 | 2/2006 | Karlsson |
| 7,075,482 B2 | 7/2006 | Karlsson |
| 7,095,779 B2 | 8/2006 | Karlsson |
| 7,099,369 B2 | 8/2006 | Karlsson |
| 7,113,820 B2 * | 9/2006 | Schlegel et al. ............. 600/523 |
| 7,126,979 B2 | 10/2006 | Karlsson |
| 2002/0181721 A1 * | 12/2002 | Sugiyama et al. ............ 381/92 |
| 2004/0114772 A1 * | 6/2004 | Zlotnick ..................... 381/92 |
| 2004/0164901 A1 | 8/2004 | Karlsson |
| 2004/0164902 A1 | 8/2004 | Karlsson |
| 2004/0208239 A1 | 10/2004 | Karlsson |
| 2006/0034324 A1 | 2/2006 | Karlsson |
| 2006/0116578 A1 * | 6/2006 | Grunwald et al. .......... 600/440 |
| 2006/0212929 A1 | 9/2006 | Karlsson |

\* cited by examiner

*Primary Examiner*—Aung S Moe
*Assistant Examiner*—Jamal Javaid

(57) ABSTRACT

An interactive graphical user interface (GUI) for displaying frequency, amplitude and direction information provided by an intelligence system is provided comprising: a plot of RF versus amplitude, and a graph of frequency versus direction. The intelligence system has a front end to generate digital data based on received radio frequency (RF) signals, a post processing stage to process the digital data, and a direction finding stage to prevent the post-processing stage from processing portions of the digital data that correspond to RF signals arriving from a direction other than a predetermined direction. The GUI is updated continuously in near real time. Methods of operating the GUI are also provided.

14 Claims, 3 Drawing Sheets

Example Diagram of a Present-day Signal Collection Graphical User Interface

Example Diagram of a Present-day Signal Collection Graphical User Interface

METHOD AND TECHNIQUE FOR THE PROCESSING AND INTELLIGENT DISPLAY OF WIDEBAND DIRECTION-FINDING DATA

CROSS REFERENCE TO RELATED APPLICATIONS

This application claims priority from U.S. Provisional Patent Application Ser. Nos. 60/600,641, 60/600,642, 60/600,643, and 60/600,657, all filed Aug. 11, 2004, incorporated by reference herein in their entireties.

FIELD OF THE INVENTION

The present invention generally relates to graphical user interface (GUI) displayable on a computer screen or other monitor for display of complex frequency, amplitude and direction information related to signal intelligence systems.

BACKGROUND OF THE INVENTION

Present day military-grade signal collection and surveillance equipment is used to capture communications transmissions from enemy radios and/or clandestine sources. A crucial piece of this equipment is the wideband receiver. The wideband receiver can intercept various wireless communications over a large subset of the RF spectrum. The interception of various wireless communications is a critical signal intelligence function that is vital for national security interests. The captured signals and raw data energy are then fed to a post-processing stage, where the actual voice or digital data is extracted. For a wideband system with direction-finding capabilities, the direction of the source of the signals is also determined.

Currently, the high end signal collection equipment that is used generates a lot of information; the amount of information exceeds the capabilities of current graphical user interfaces (GUIs) to display the information to the operator. This is a significant problem today. The modern military unit or intelligence organization needs GUI tools to display (intuitively and automatically) the massive amounts of data and computation results that state-of-the-art wideband systems with DF capability generate. This present requirement is critical since currently there are not enough human resources to analyze all captured signal data properly.

Prior art methods for the GUI display of direction attributes of signal data are archaic, because they are designed for use with systems that employ only narrowband receivers. The prior art GUI displays are very limited in their use and incapable of displaying the range of signal attributes detected by today's wideband systems. Among these attributes are frequency, amplitude, and direction.

Over time, the capabilities of wideband systems will grow exponentially. As more and more data is received, modern user interfaces of wideband systems must adapt so as not to overwhelm the user with data. This flood of detected data poses a significant threat to national security since the intelligence information ages quickly, and thus as much of the signal data as possible needs to be understood very quickly. The GUI needs to abstract the data at a high enough level so that the user is protected from the flood of raw information. The raw information is still very important, so while the GUI needs to show a high level of abstraction, the GUI also needs to allow the user to drill down into any specific data of interest. Thus the capability of the GUI must grow exponentially to meet the demands of growing amounts of detected data.

What is needed therefore in order to quickly understand and interact with the many signals detected by modern wideband signal collection systems is a real-time graphical user interface that can handle the display of much information, intuitively and interactively. What is needed is an invention that not only: 1) Preserves the capabilities and intuitive nature of prior art systems, but also 2) adds capabilities far beyond prior art systems, to display many attributes of received signals in various dimensions and graphs, in real time.

SUMMARY OF THE INVENTION

The invention of this patent helps the operator to understand the received data as quickly as possible. The invention of this provisional patent application is clearly superior to prior art methods because it allows the signal detection system user to grasp much more information much more quickly. The invention also allows the user to interact with the data in novel and unique ways. This invention is therefore vital to the interests of United States national security; the display of signal intelligence data is far more efficient than prior art GUI methods.

The capabilities of this invention are only possible given the parallel, real-time nature of the direction-finding calculations of the invention described U.S. Provisional Patent Application Ser. No. 60/600,657, entitled "Improved Method And Signal Intelligence Collection System That Reduces Output Data Overflow in Real Time." Because the compass direction of the sources of signals is one dimension of the data shown, the graphic display of many directions in parallel depends on the parallel real-time calculations of many directions by the invention of the previous patent.

The method of this provisional patent application provides such a graphical user interface (GUI). In conclusion, insofar as I am aware, no invention formerly developed provides this unique method to display the characteristics of received signals, transmitted from a specified direction or sector, in real-time.

DETAILED DESCRIPTION OF THE INVENTION

The continuing development of wideband radio frequency receivers for collecting vast amounts of signal intelligence data magnifies the complexities inherent in understanding and analyzing all the data. The comprehension and analysis problems are only exacerbated by the addition of direction-finding capabilities to wideband systems; yet more attributes of signals can be determined. There is an urgent need in the U.S. and foreign military and intelligence communities to create systems that can display all the attributes of signals in more intelligent ways. The problem is the wide range of information that is output from present-day signal collection systems.

Wideband receiver technology today is advancing rapidly, allowing many more signals to be captured and collected, much faster than ever before. A fundamental change in signal intelligence display technology is needed for the modern military force or intelligence organization to avoid being swamped by such a massive glut of information. The modern military force or intelligence organization needs the capability to analyze signal data in a timely manner, no matter how much data is captured and collected.

It is an object of the present invention to provide graphical user interface technology to display intuitively as much data as possible, for as many attributes of signals as possible. Such a system is unique in the number and type of signal attributes it displays; such a system is also unique in the number and type of input parameters it offers to the operator to allow the operator to tailor the displayed results. Such a system solves the efficiency and incompleteness issues of prior art systems. Such a system greatly enhances the operational capabilities of the modern intelligence organization, by allowing the organization to understand patterns and trends in signal data quickly and intuitively. Such a system can rely only on the data collection and direction finding capabilities of the invention described in U.S. Provisional Patent Application Ser. No. 60/600,657, entitled "Improved Method And Signal Intelligence Collection System That Reduces Output Data Overflow in Real Time," incorporated by reference herein in its entirety, so that the attribute of compass direction for many simultaneous signals can be displayed intuitively to the operator.

The preferred system includes all the abilities of the system described by the U.S. Provisional Patent Application Ser. No. 60/600,657. Also, the preferred system provides the user interface described, thereby enhancing efficiency and comprehension in the signal analysis processing and post-processing pipeline.

Figure 1:
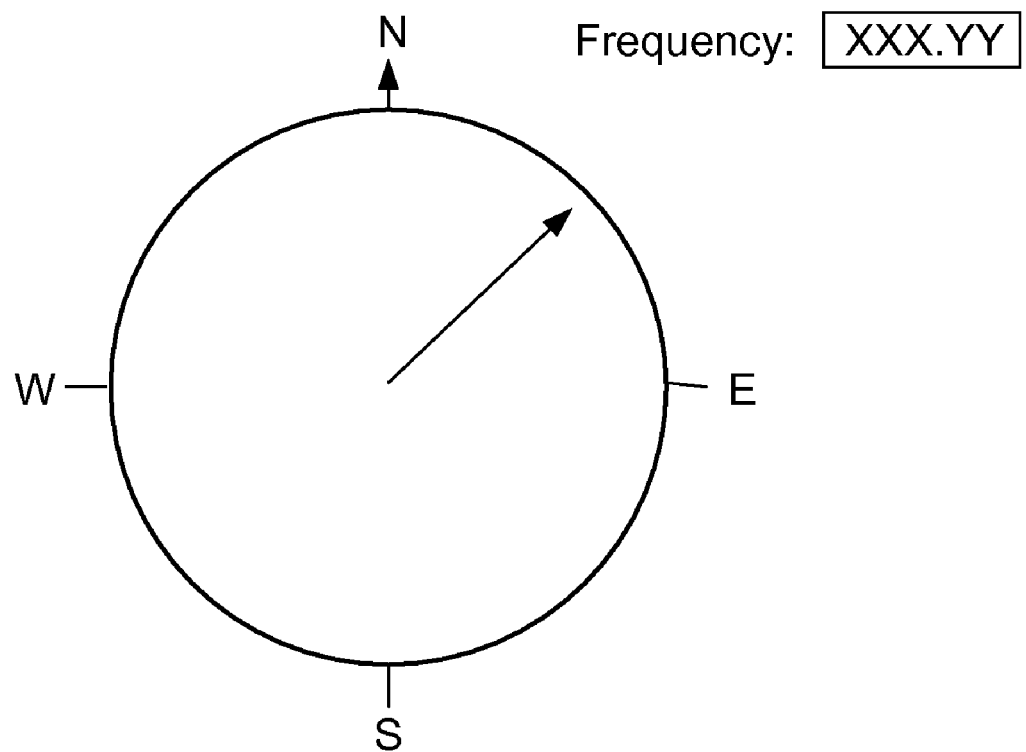
FIG. 1 is a diagram of a prior art graphical user display of current signal processing and analysis systems.

FIG. 1 shows a diagram of a prior art graphical user display of current signal processing and analysis systems in common use in today's signal processing systems. The display is a simple compass display, showing the direction from the narrowband receiver to the source of the signal received. The arrow indicates the direction, and the numeric display indicates the frequency of the signal. Thus the display is an archaic compass display that shows only two pieces of data simultaneously.

This prior-art display is useful for only narrowband, single frequency systems, as it can display the direction of only one frequency at a time. The display is not even a two-dimensional graph of frequency versus direction because the present day narrowband systems can monitor only one frequency at a time. It is thus a one-dimensional display of data. Not shown by the display are other frequencies, or even the amplitude of the signal at the frequency. However, wideband systems receive signals of many frequencies simultaneously.

Figure 2:
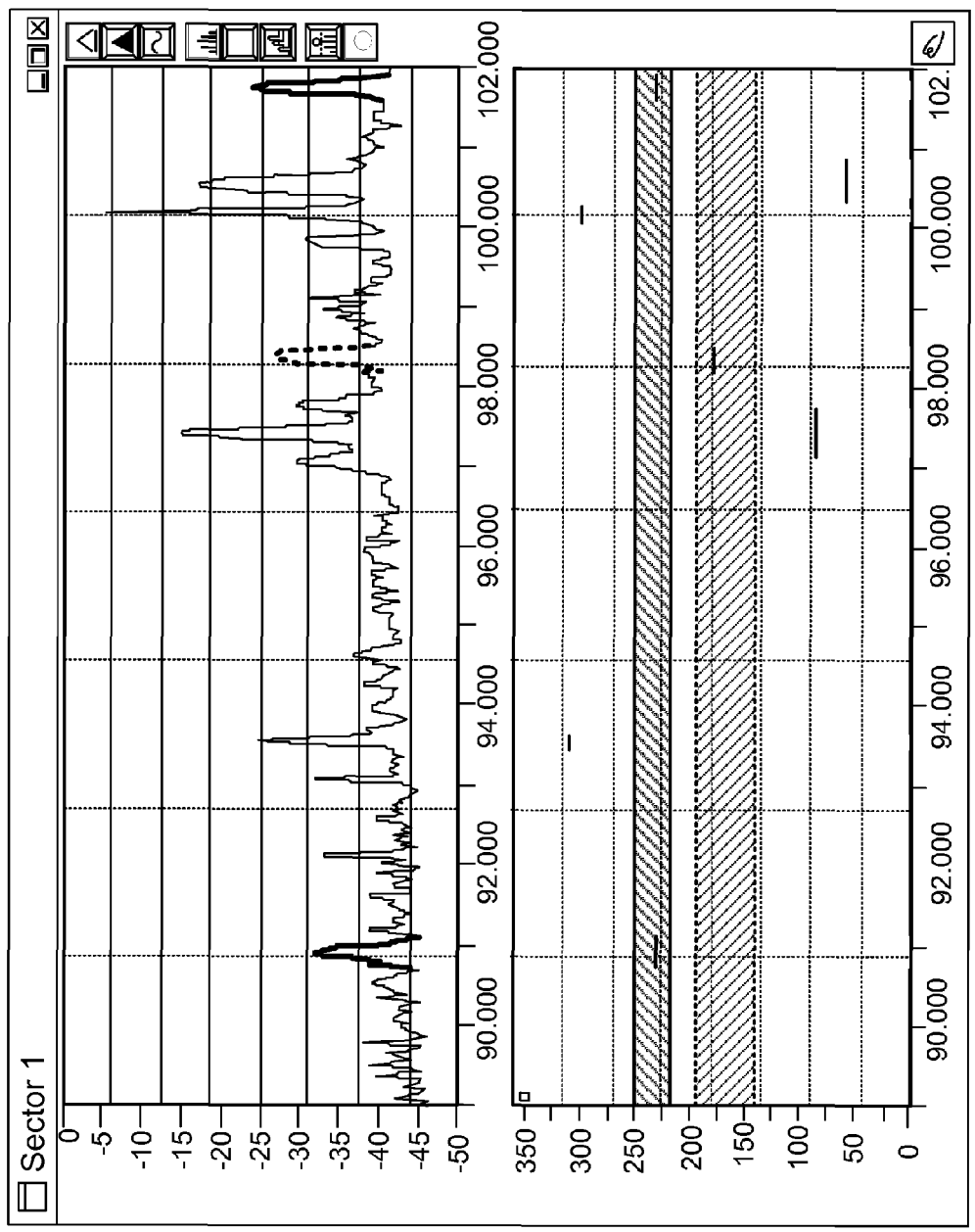
FIG. 2 is a drawing of one embodiment of the graphical user display that is the invention of this provisional patent application.

FIG. 2 shows an example of the display of the invention. The display is comprised of two main sections: a standard RF spectrum display of frequency versus amplitude, and a two-dimensional graph of frequency versus direction. The RF spectrum display is placed on top of the other graph, in such a way so that the frequency ranges of the two plots match each other.

The green highlighted area of the lower plot is a sector of interest to the operator. The amplitudes drawn in green in the upper plot, the green spikes, correspond to the amplitudes of signals found originating from the sector of interest. The same is true for the red highlighted sector. Furthermore, areas can overlap between the two sectors of interest, and their colors will add according to a lookup table.

All GUI drawing is done in near real-time, with no human intervention. The plots are continuously updated as the wideband receiver collects new signal information every few microseconds. The display shows three complete dimensions of the state of the RF spectrum, the three dimensions being the three attributes of frequency, amplitude and direction—for all frequency points within the RF spectrum. The display is divided into two graphs, on above and one below. The upper graph is a graph of amplitude versus frequency and the lower graph is a graph of direction versus frequency. Both these graphs cover a wide range of frequencies, monitored simultaneously.

The bottom half of the display is a plot of frequency versus direction; as the direction for each frequency is calculated, a point is plotted on the graph. Thus for signals with strong amplitudes above a user defined threshold, long horizontal lines show up in the lower graph corresponding to the direction of those incoming signals, as calculated by the hardware. These long horizontal lines stand out dramatically in the graph, and the operator sees instantly the direction of any strong signals.

The lower half of the display is very interactive; it allows the user to change almost all its display characteristics. Among these changeable display parameters are the range of direction values to plot, the width of the sectors of interest, how many sectors of interest to highlight, and so forth.

The top half of the display is the classic RF spectrum plot of amplitude versus frequency. The drawing of this plot reacts to user changes made in the lower plot; for example, if the user changes the color of a sector of interest, the frequencies from that sector are drawn in the new color in the upper plot.

The capabilities of this invention thus solve the limited usefulness and limited data shown by the prior art GUIs. The capabilities of this invention are only possible given the signal collection and direction finding capabilities of the invention described in U.S. Provisional Patent Application Ser. No. 60/600,657, "Improved Method And Signal Intelligence Collection System That Reduces Output Data Overflow in Real Time."

Alternate Embodiments

One alternate embodiment of the GUI is for the horizontal midline of the lower graph to be locked to a particular direction. That direction could be true north, or some other user-defined direction. For example, if the system invention was installed on a military vehicle, and the vehicle was parked facing a particular compass heading, the graph's horizontal midline could be locked to that direction. Compass angles to the vehicle's left would then be plotted above the midline; compass angles to the right would be drawn below the midline.

Figure 3:
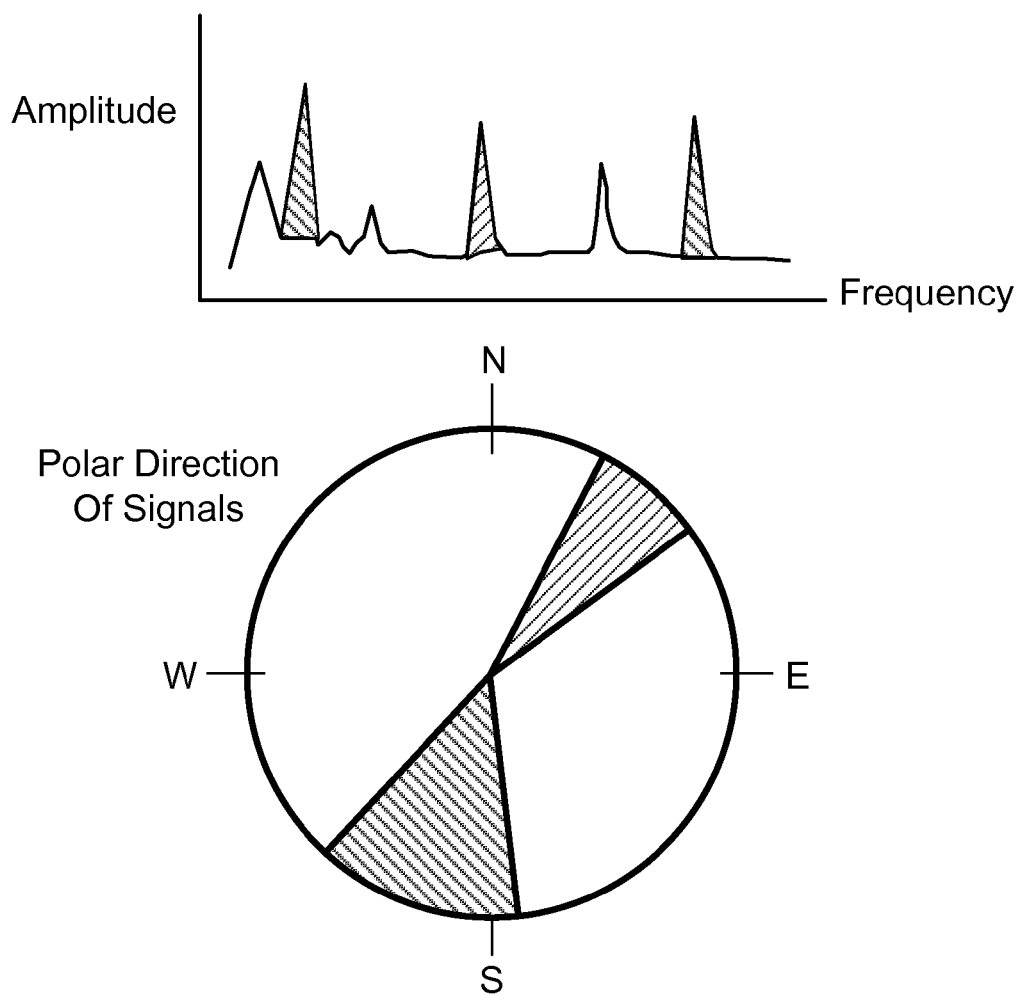
FIG. 3 is a drawing of an alternate embodiment of the GUI invention.

Another possible embodiment is for the lower graph to be plotted in polar coordinates instead of rectangular, Cartesian coordinates. The angle in polar coordinates would be the compass direction; the radial axis would be the frequency. FIG. 3 illustrates such an alternative embodiment: it shows a compass circle connected to wideband spectrum data. The colors on the spectrum correspond to the colors of swaths of the compass circle drawn out by the mouse. This embodiment of the lower graph would show compass directions more intuitively, at the expense of showing the frequency data possibly less intuitively. Also more intuitive would be the result that the long horizontal lines discussed above would become long radial lines, pointing in the direction of the signal's source. And on a polar plot, the operator could sweep out compass sectors of interest radially, in a more intuitive way.

For this embodiment, the upper and lower graphs would need to be split from each other and shown in separate viewports, as their frequency axes would no longer line up vertically.

This invention is unique since no other user interface has the capability or performance to display this data in this manner, and in real-time. It will be understood that the designation of upper and lower is purely arbitrary or at the discretion of the user.

Operation

The invention of this patent adds intuitive, complete user interface interaction to the invention described in U.S. Provisional Patent Application Ser. No. 60/600,657, entitled "Improved Method And Signal Intelligence Collection System That Reduces Output Data Overflow in Real Time," incorporated by reference herein. Adding such a complete, intuitive interface is necessary because of the amount of data the system operator needs to understand and interact with. The data has three attributes, frequency, amplitude, and direction, and thus needs all three attributes displayed on different axes in two two-dimensional graphs.

Before the system invention starts standard operation, the operator can use the interface to setup how much data will be displayed. The operator does this by setting the ranges of the axes of the graphs to be shown. The operator can limit the amount of frequencies to be shown, and also the range of directions to be shown. For example, if the operator knows a priori the general direction of the area of interest, the operator can narrow the direction scale's range to show only that compass sector.

During the setup phase, the operator also sets how fast the commutating antenna switches, how fine the resolution of the FFT calculations should be, and so forth. These settings do not show up explicitly in the GUI; their function is explained in the previous provisional patent application.

The operator then places the system into operation, and the wideband receiver starts collecting data. While the wideband system continuously collects data, data is displayed automatically in the two graphs, frequency versus amplitude, and frequency versus direction.

The operator may choose various colors for the display of each sector of interest's data. For example, if the operator commands the GUI to show all data from a specific sector in green, then data for that sector is shown in green in both the upper and the lower plots. See FIG. 2 for an example of this. The green horizontal bar in the lower graph of FIG. 2 is a sector of interest; its angle extents and its green color were chosen the user. The upper graph in the GUI responds to this color choice by drawing all amplitude data from that sector in green as well. So the operator can see easily and intuitively the energy of the signals received from the specific chosen sector.

The operator can use the mouse to drag the top and bottom lines of the color bar in the lower graph. This adjusts the angle extents of the sector of interest in real time. The top graph also responds in real time, drawing all amplitudes for the new sector in the color green.

The operator can drag the whole bar up and down as well. Moving the entire bar up and down has the practical effect of sweeping the sector around the points of the compass. Again, the upper graph reacts accordingly, in real time, to draw amplitudes of signals from those compass points in the sector's color.

The operator can analyze and interact with more than one sector at a time, by choosing a new sector with a new color. The new sector can be interacted with in the same manner as already describe. Thus two or more sectors can be analyzed at the same time, each in their own color.

If two sectors of different colors overlap in the lower graph, the overlapping portion will be drawn in a color that is the color sum of the two sector's individual colors. This color sum is calculated in RGB color space. A green sector overlapping a blue sector would cause the overlapped area to be drawn in the color cyan, for example. The operator can override this automatic color choice, if desired. Again, the upper graph responds accordingly by drawing all amplitudes from the overlapped portion in the combined color.

What is claimed is:

1. An interactive graphical user interface (GUI) for displaying frequency, amplitude and direction information provided by an intelligence system having a front end to generate digital data based on received radio frequency (RF) signals, a post processing stage to process the digital data, and a direction finding stage to prevent the post-processing stage from processing portions of the digital data that correspond to RF signals arriving from a direction other than a predetermined range of directions, comprising:

a plot of RF versus amplitude based on the frequency information and the amplitude information provided by the intelligence system, displayed simultaneously with a graph of frequency versus direction based on the frequency information and the direction information provided by the intelligence system;

wherein the frequency information of both the plot and the graph covers a range of simultaneously monitored frequencies of the RF signals arriving from the predetermined range of directions; and wherein user interaction with the graph sets i) the predetermined range of directions, and ii) a range of frequencies, which predetermined range of directions and range of frequencies configure the direction finding stage.

2. The graphical user interface of claim 1, wherein the plots are arranged such that the frequency ranges of the two plots match each other.

3. The graphical user interface of claim 1, wherein the plot of RF versus amplitude is responsive to user changes made in the graph of frequency versus direction.

4. The graphical user interface of claim 3, wherein the user changes made in the plot of frequency versus direction comprise the range of direction values to plot, the width of the sectors of interest, the color of a sector of interest, or highlighting of sectors of interest.

5. The graphical user interface of claim 1, wherein the plot and graph are continuously updated as the intelligence system collects new signal information.

6. The graphical user interface of claim 1, wherein the horizontal midline of the graph of frequency versus direction can be locked to a particular direction.

7. The graphical user interface of claim 1, wherein the graph of frequency versus direction is plotted in polar coordinates or Cartesian coordinates.

8. A method for providing a graphical user interface for displaying frequency, amplitude, and direction information, comprising:

providing frequency, amplitude, and direction information from an intelligence system having a front end to generate digital data based on received radio frequency (RF) signals, a post processing stage to process the digital data, and a direction finding stage to prevent the post-processing stage from processing portions of the digital data that correspond to RF signals arriving from a direction other than a predetermined range of directions on different axes in two two-dimensional graphs; and displaying the two two-dimensional graphs simultaneously;

wherein the frequency information of both of the graphs covers a range of simultaneously monitored frequencies of the RF signals arriving from the predetermined range of directions; and wherein user interaction with one of the graphs sets i) the predetermined range of directions, and ii) a range of frequencies, which predetermined range of directions and range of frequencies configure the direction finding stage.

9. The method of claim 8, wherein the two two-dimensional graphs are RF versus amplitude and frequency versus direction.

10. The method of claim 8, wherein the intelligence system continuously collects and displays data automatically in near real time in the two graphs.

11. A method for operating a graphical user interface for displaying frequency, amplitude, and direction information from an intelligence system having a front end to generate digital data based on received RF signals, a post processing stage to process the digital data, and a direction finding stage to prevent the post-processing stage from processing portions of the digital data that correspond to RF signals arriving from a direction other than a predetermined range of directions, comprising:

controlling the quantity or attributes of direction, frequency or amplitude data displayed;

in response to the controlling, simultaneously displaying information based on the frequency, amplitude and direction information from the intelligence system, wherein the frequency information covers a range of simultaneously monitored frequencies of the RF signals arriving from the predetermined range of directions; and in response to user interaction with the displayed information, setting i) the predetermined range of directions, and ii) a range of frequencies, which predetermined range of directions and range of frequencies configure the direction finding stage.

12. The method of claim 11, wherein controlling the quantity of direction data comprises narrowing the direction scale's range to show a particular compass sector.

13. The method of claim 11, wherein controlling the attributes of data comprises choosing display colors for the display of data from each sector of interest.

14. The method of claim 11, wherein the method comprises analyzing and interacting with more than one sector at a time.

* * * * *